United States Patent [19]
Preslar

[11] 4,442,409
[45] Apr. 10, 1984

[54] PUSH-PULL NON-COMPLEMENTARY TRANSISTOR AMPLIFIER

[75] Inventor: Donald R. Preslar, Plainfield, N.J.

[73] Assignee: RCA Corporation, New York, N.Y.

[21] Appl. No.: 352,179

[22] Filed: Feb. 25, 1982

[51] Int. Cl.[3] .................................. H03F 3/30
[52] U.S. Cl. .................................. 330/274; 330/255; 330/270
[58] Field of Search ............... 330/255, 264, 265, 267, 330/268, 269, 270, 273, 274, 275

[56] References Cited

U.S. PATENT DOCUMENTS

| | | | |
|---|---|---|---|
| 3,454,889 | 7/1969 | Petrie | 330/270 |
| 3,728,638 | 4/1973 | Seki et al. | 330/290 |

FOREIGN PATENT DOCUMENTS

| | | | |
|---|---|---|---|
| 56-56014 | 5/1981 | Japan | 330/273 |

OTHER PUBLICATIONS

M. J. Teague, "Get PNP Class–B Stage Efficiency", 3-15-67, Electronic Design 6, pp. 238-240.

Primary Examiner—James B. Mullins
Attorney, Agent, or Firm—E. M. Whitacre; J. S. Tripoli; E. P. Herrmann

[57] ABSTRACT

A push-pull amplifier having like conductivity output transistors is driven by a phase-splitter transistor amplifier. The collector load of the phase-splitter includes a diode bridge for establishing the amplifier idling current. One arm of the bridge incorporates the pull-up output transistor base-emitter junction-the current conducted therein being accurately determined by bridge parameters.

13 Claims, 4 Drawing Figures

PUSH-PULL NON-COMPLEMENTARY TRANSISTOR AMPLIFIER

BACKGROUND OF THE INVENTION

This invention relates to complementary amplifier circuitry and more particularly to circuitry for biasing a push-pull stage to substantially eliminate crossover distortion.

Non-Complementary-Transistor push-pull amplifiers traditionally comprise a pair of like conductivity output transistors with their principal conduction paths connected in series between supply potentials. The control electrodes of these transistors are driven antiphase by a class A amplifier in such a fashion that only one of the output transistors conducts at a time to minimize power dissipation in the amplifier. These amplifiers tend to distort the signal at the output potential level where one of the output transistors is turning on and the other is turning off. To overcome this problem the output transistors may be biased so that in the quiescent state, i.e., at the crossover potential, both transistors remain in conduction. This, however, generally requires that the stage driving the output transistors be biased to pass significant current resulting in added power dissipation.

A. F. Petrie in U.S. Pat. No. 3,454,889 describes a push-pull stage (FIG. 1) wherein the output transistors are driven by a phase splitter including a bipolar transistor (npn) having a first resistor connected in its emitter circuit and a second resistor connected in its collector circuit. The control electrode of the pull down (npn) output transistor is connected to the emitter electrode of the driver transistor and the control electrode of the pull up output transistor (npn) is connected to the collector electrode of the driver transistor. In addition, a diode is connected between the emitter electrode of the pull up transistor and the collector electrode of the driver transistor poled to conduct in the direction toward the collector of the driver transistor. This arrangement tends to constrain the collector potential of the driver transistor from falling below some minimum potential, the effect of which provides extra base current drive to the pull down output transistor. However, the potential drop across the diode also reverse biases the base-emitter junction of the pull up output transistor turning it hard off which in turn contributes to cross over distortion. A further shortcoming of this circuit when it is implemented in integrated circuit form is the difficulty of controlling the absolute value of the resistors in the driver circuit. This results in difficulty in controlling the amplitude of the idling current conducted by the output transistors.

M. J. Teague in the article, "Get pnp Class-B Stage Efficiency" in the March 15, 1967 issue of *Electronic-Design* magazine (pp. 238–240) describes a non-complementary push-pull amplifier (FIG. 2) comprising a driver transistor with collector and emitter resistors, the collector and emitter of the driver respectively driving the control electrodes of the pull-up and pull-down output transistors. This circuit includes a first diode connected between the emitter electrode of the pull-up transistor and the collector electrode of the pull-down transistor and poled to conduct in the direction of the pull-down transistor. Two additional diodes are connected in series between the control electrode of the pull-up transistor and the collector of the pull-down transistor. The two series diodes parallel the series connection of the base-emitter of the pull-up transistor and the first diode to form a diode bridge which establishes the idling current in the pull-up transistor. Output signal is taken from the emitter electrode of the pull-up transistor and base current to the driver transistor is supplied by a feedback resistor connected between the output terminal and the base electrode of the driver transistor. In addition to supplying base current to the driver transistor, the feedback resistor is necessary to stabilize the small signal voltage gain over varying output voltage levels.

There are two obvious shortcomings of this circuit. The first is that bias current for the pull-up transistor is regulated by a resistor which tends to make the output standby current dependent upon the no load output potential. The second is that base drive to the driver stage is limited by the feedback resistor which operates in a degenerative mode, i.e., when the pull-down transistor is on, the output potential is low so that little base current is provided through the feedback resistor to the emitter-follower driver. Since the inherent capacitance at the control electrode of the driver transistor must be charged and discharged by signal current through the feedback resistor, the presence of the feedback resistor tends to reduce the bandwidth of the amplifier.

A further shortcoming of the circuit is that the imposition of the diode between the output terminal and the pull down transistor tends to increase the output impedance of the amplifier.

SUMMARY OF THE INVENTION

The present invention takes advantage of the beneficial aspects of the two foregoing push-pull amplifier circuits without suffering their detrimental aspects. The invention includes first and second output transistors of the same conductivity type serially connected as a push-pull output stage between relatively positive and relatively negative supply potentials. A first constant current source is connected between the relatively positive supply potential and the control electrode of the first (pull-up) transistor. A second constant current source of like current amplitude to the first and poled in the same direction thereto is connected between the relatively negative supply potential and the control electrode of the second (pull-down) transistor. A first diode is connected in parallel with the second current source, the first diode and the pull down transistor forming a current mirror having input and output terminals at the control electrode and collector electrode of the pull down transistor respectively. A third (driver) transistor having a control electrode arranged for receiving signal current, has its emitter electrode connected to the control electrode of the pull-down transistor. Second and third diodes are serially connected between the collector electrode of the driver transistor and the control electrode of the pullup transistor and a fourth diode is connected between the emitter-collector interconnection of the pull-up and pull-down output transistors and the collector electrode of the driver transistor. The second, third and fourth diodes are poled to conduct in the direction toward the driver transistor and form a diode bridge with the base-emitter junction of the pull-up transistor to establish idling currents in the amplifier.

Current from the first current source is conducted by the second and third diodes developing a potential thereacross which establishes the idling current level in the pull-up transistor. A portion of the idling current passed by the pull-up transistor is diverted by the fourth diode and summed with the current from the first source at the collector of the driver transistor. The total current is applied to the control electrode of the pull-down transistor via the collector-emitter conduction path of the driver transistor. At the control electrode of the pull-down device the portion of the total current which was supplied by the first source is shunted to the supply terminal by the second current source. The contribution of the total current diverted thereto by the fourth diode is mirrored in the collector-emitter circuit of the pull-down transistor to establish the idling current therein.

By proper geometric proportioning of the first diode and the base-emitter junction of the pull down transistor and of the second, third and fourth diodes relative to the base-emitter junction of the pull-up transistor, desired idling currents are established in the output transistors and the quiescent current passed by the driver stage can be maintained at a relatively low level to minimize power dissipation. The idling current remains constant at the desired level regardless of the no load output potential. There is no diode between the serially connected output transistors. The fourth diode provides a source of drive current for driving the pull down transistor from the output connection without biasing the pull-up transistor totally off because the constant current impressed on the other arm of the bridge develops sufficient potential thereacross to keep the pull-up transistor in a conductive state.

DETAILED DESCRIPTION OF THE INVENTION

Figure 1:
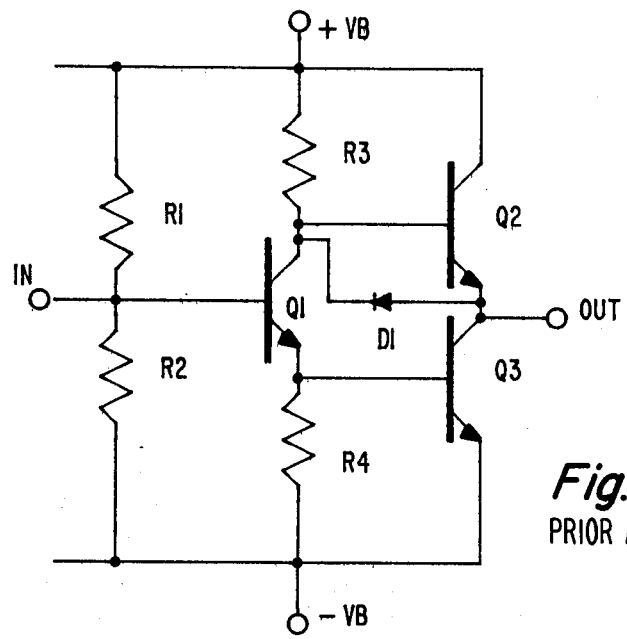
FIGS. 1 and 2 are prior art non-complementary transistor push-pull amplifier circuits.
Figure 2:
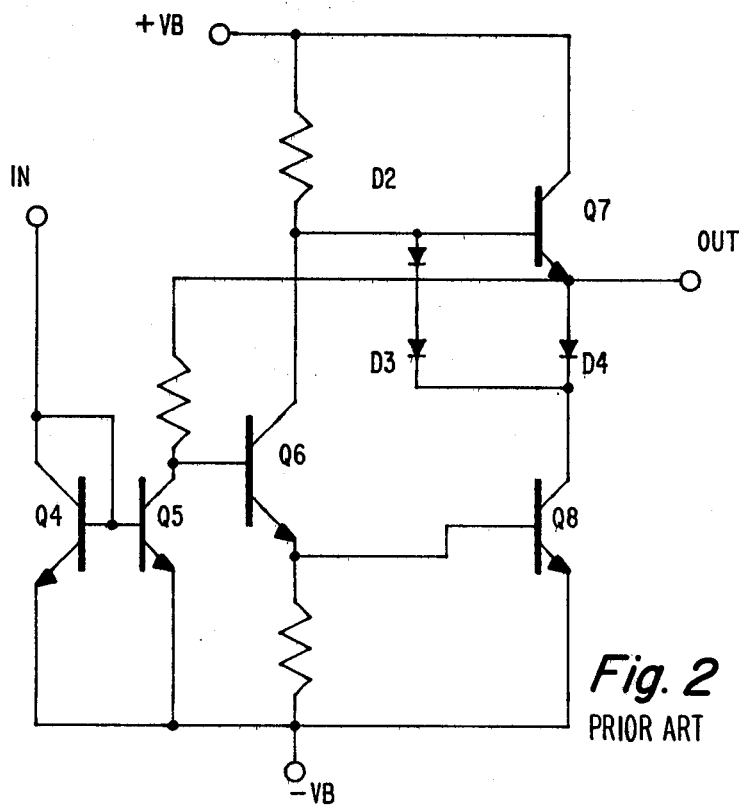

Referring to the drawings, FIG. 1 is an embodiment of the aforementioned Petrie circuit and FIG. 2 is an embodiment of the Teague circuit. For a detailed description of these circuits the reader is directed to the cited references.

Figure 3:
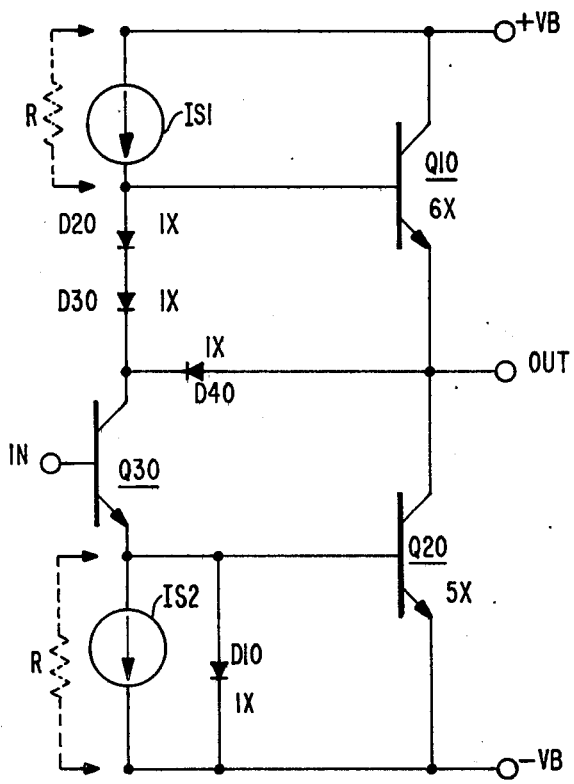
FIGS. 3 and 4 are circuit schematic diagrams of non-complementary transistor amplifiers embodying the present invention.

FIG. 3 is a schematic diagram of a push-pull amplifier using a single conductivity type transistor. In the circuit a pull-up output transistor Q10 has its principal conduction path serially connected with the principal conduction path of the pull-down output transistor Q20 between the relatively positive supply potential $(+)V_B$ and a relatively negative supply potential $(-)V_B$. The base electrode of transistor Q10 is driven by driver transistor Q30 operating as a common emitter amplifier with a collector load comprised of the constant current source IS1. The base of transistor Q20 is driven by driver transistor Q30 operating as an emitter-follower with an emitter load comprising current source IS2. The signals applied to the base electrodes of transistor Q10 and Q20 are 180° out of phase or complementary.

A first diode D10 is connected between the base and emitter electrodes of transistor Q20. Diode D10 is preferably an npn transistor similar to transistor Q20 but with its base and collector electrodes interconnected. This type of arrangement configures diode D10 and transistor Q20 respectively as the master and slave sections of a current mirror amplifier with the gain factor thereof determined by the ratio of the base-emitter junction area of transistor Q20 to the base-emitter junction area of the diode. In the illustrative circuit the ratio is 5, i.e., the relative areas of the devices are designated on the schematic as 5x units and 1x units yielding a ratio of 5. Assuming that the base current of transistor Q20 is negligible, the excess of transistor Q30 emitter current over the current sink IS2 is conducted in diode D10, which current is mirrored 5 fold in the collector-emitter circuit of transistor Q20.

The serial connection of diodes D20 and D30 and the series connection of diode D40 with the base-emitter junction of transistor Q10 form a diode bridge between the collector electrode of transistor Q30 and the base electrode of transistor Q10. The diodes D20, D30 and D40 are preferably constructed as transistors similar to transistor Q10 but with their respective collector and base electrodes interconnected to enable them to function as diodes. The diodes D20, D30 and D40 in the circuit have base-emitter junction areas of 1x units and the base-emitter junction area of transistor Q10 is 6x units.

Idling currents in the driver stage including transistor Q30 and the output stage including transistors Q10 and Q20 are established by the current source IS1 and the junction area ratio of the devices comprising the diode bridge. For purposes of analysis assume that the transistor Q10 base current is negligible. Under this condition all of the current supplied by source IS1 is conducted in diodes D20 and D30. For diodes D20 and D30 of like size equal potentials are developed across both diodes. This potential is applied across the series connection of diode D40 and the base-emitter junction of transistor Q10. Assume one half the potential or the potential across diode D20 is impressed across the base-emitter junction of transistor Q10 and that one half the potential or the potential across diode D30 is impressed across diode D40. Under this set of conditions the current conducted by diode D40 will equal the current conducted by D30 and the current conducted by the emitter of transistor Q10 will be six times the current conducted by diode D20. To satisfy this assumption, five units of current must be shunted from the interconnection of diode D40 and the emitter electrode of transistor Q10 by the collector circuit of transistor Q20. The current conducted by diodes D30 and D40 are summed at the collector electrode of transistor Q30 and is equal to two times the current supplied by source IS1. This current is passed to the emitter electrode of transistor Q30 and a current equal to the current supplied by source IS1 is shunted to the $(-)V_B$ supply by source IS2. The remaining current equal to the current IS1 is conducted by diode D10 and reflected by a factor of 5 in the collector-emitter of transistor Q20, satisfying the foregoing assumption that transistor Q20 shunts five units of the current conducted by the emitter of transistor Q10.

In order to realize the circuit of FIG. 3 it is necessary to closely match the conduction characteristics of the active devices and to match the sourcing current of source IS1 to the sinking current of source IS2. The former condition is easily achieved when the circuit is implement in integrated circuit form simply by careful control of device geometric parameters. Further by arranging the relevant elements in close proximity to one another their thermal responses will track one another. Like source and sink currents from IS1 and IS2 can be achieved by the use of complementary current mirrors as is well known in the circuit arts.

The value of the current supplied by source IS1 need only be large enough to supply sufficient base current to drive transistor Q10 to produce the desired emitter currrent at the output terminal. Since the current gain that can be realized in npn transistors is relatively high the value of IS1 can be relatively small, e.g., several milliamperes. Consider the illustrative circuit of FIG. 3. If IS1 supplies 3 milliamperes the emitter of transistor Q10 supplies 18 milliamperes of idling current to the output terminal. Three milliamperes of this current is shunted from the output terminal by the diode D40. This 3 milliamperes of current is then directed through diode D10 which develops a potential at the base electrode of transistor Q20 which conditions transistor Q20 to conduct precisely 15 milliamperes of current in its collector-emitter circuit. The total quiescent power dissipated by the amplifier is the sum of the currents IS1 and the emitter current of transistor Q10 times the difference of the supply potentials, i.e., the power is $21 \times (+V_B - (-)V_B)$ milliwatts. The fact that substantially no drive current to the pull-down transistor Q20 is provided by the bias source IS1 significantly reduces the power dissipated in the bias circuitry. The power dissipated is accurately controllable and determined by the drive requirements and the desired idling currents.

Dynamic operation of the circuit proceeds as follows. As the input potential swings negative the driver transistor Q30 conducts less of the current sourced by IS1. This current is diverted into the base electrode of transistor Q10 causing the emitter to source a greater current to the output terminal. As the input potential swings positive transistor Q30 turns on harder causing its collector potential to go low inducing diode D40 to conduct greater current from the output terminal. This additional current is conducted via transistor Q30 to the base of transistor Q20 turning it on harder to sink current from the output. Because signal drive current to the base electrode of transistor Q20 is derived from the output terminal via diode D40, it is proportional to the load being driven and does not demand drive current from either the pull-up transistor Q10 or the bias source IS1.

It should be noted at this point that the use of like conductivity output transistors is desirable for two reasons. First the static and dynamic properties of the pull-up and pull-down transistors are more easily matched, a property which tends to enhance the linearity of the circuit and facilitate establishment of idling current. Secondly, for high frequency operation it is advantageous to employ npn transistors as they have superior frequency response over present day pnp transistors. This factor does not preclude the use of pnp transistors in the biasing elements (e.g., the current sources), however, since they conduct substantially in the d.c. mode for this application. It should also be appreciated that for those applications where circuit simplicity is paramount, the current sources IS1 or IS2 may be realized with resistors as shown in broken lines in FIG. 3. However, for the situation where source IS1 is a resistor, the bias current level is dependent upon the no load output potential.

Figure 4:
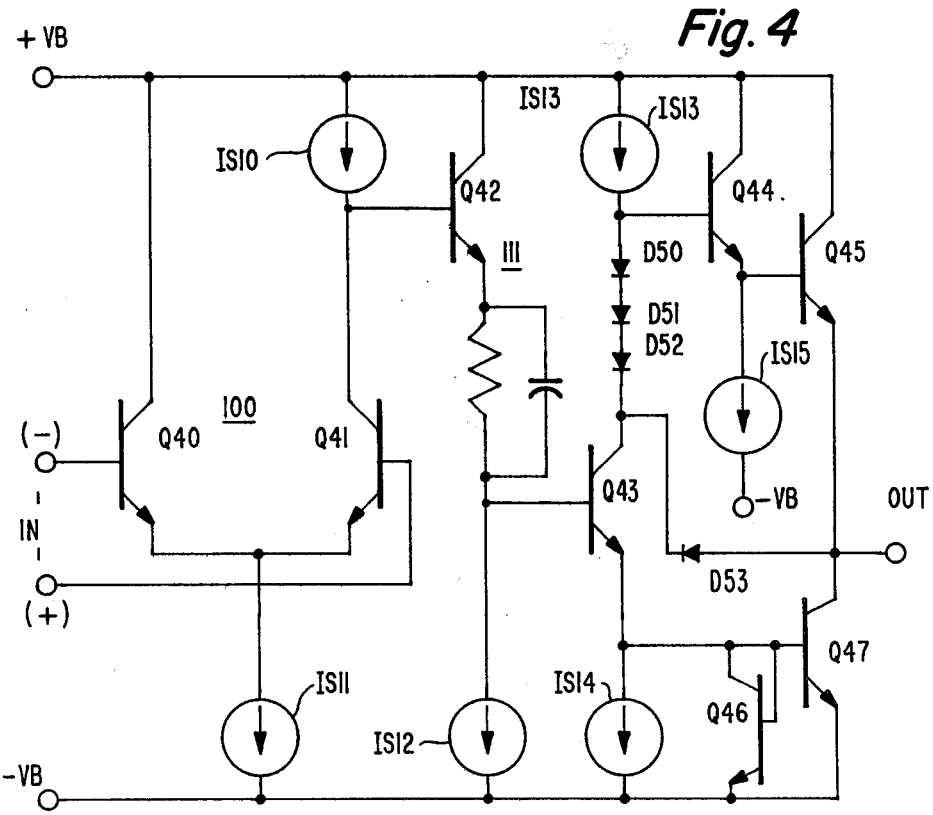

FIG. 4 shows a variation of the foregoing push-pull amplifier incorporated as the output stage of a wide band operational amplifier. In this circuit all of the signal handling transistors are npn devices in order to realize higher frequency response. The circuit includes a differential input stage 100 comprising an emitter coupled transistor pair Q40 and Q41 having emitter current supplied by the current source IS11. Output signal from stage 100 is taken from the collector electrode of transistor Q41 and applied to the level shifting stage 111 including emitter follower biased transistor Q42 with current source IS12 providing an emitter load. Stage 111 translates the internal DC component of the signal to a potential suitable for application to the driver-phase splitting transistor Q43 which has its emitter electrode biased near the relatively negative supply potential $(-)V_B$.

The push-pull output amplifier stage including transistors Q43, Q44, Q45 and Q47 is structurally similar to the FIG. 3 circuit and operates as described in the foregoing. In the FIG. 4 arrangement however the base drive from the current source IS13 to the pull-up transistor Q45 is buffered by the emitter-follower amplifier Q44. This buffering has the effect of (a) in the quiescent state reducing the current shunted by the base electrode of the pull-up transistor from the source IS13 thereby enhancing the accuracy of the diode bridge in establishing the idling currents and (b) reducing the amplitude of the current source IS13 because the current gain of the output transistor Q45 is multiplied by the current gain of the buffer transistor Q44. A reduction of the amplitude of IS13 reduces the power dissipated in the circuit.

Interposing the emitter-follower buffer between the current source IS13 and the pull-up transistor Q45 places an added pn junction in the diode bridge arm having the base-emitter junction of the pull-up transistor therein. It thus becomes necessary to add a third diode in the bridge arm connected between the source IS13 and the collector electrode of the driver transistor Q43 to balance the bridge.

Consider the three diodes D50, D51 and D52 to be of like size. The potential developed across each diode is proportional to the logarithm of the current density conducted in the junction, i.e., $V_D \propto \ln(I/A)$ where $V_D$ is the diode voltage, I is the current conducted in the diode and A is the area of the pn junction. It is apparent that for a given current the potential increases inversely with diode area so that for a given potential the current increases with area. A similar relationship holds for the base-emitter potential of a transistor. Because the potential across both arms of the bridge must be equal it can be shown to a close approximation, at least for devices formed on the same silicon die, that the current-area relationship of the devices in both arms may be represented by the equation:

$$ID50/AD50 \cdot ID51/AD51 \cdot ID52/AD52 = IQ44/AQ44 \cdot IQ45/AQ45 \cdot ID3/AQ53 \qquad (1)$$

where the respective numerators are the currents conducted by the respective diode pn junctions or the respective transistor base-emitter junctions and the respective denominators are the pn junction areas of the respective diodes or the base-emitter junction areas of the transistors. Note that each of the terms must be treated independently, i.e., neither the numerators nor the denominators on each side of the equation can be commutated in the equation. The equation can be balanced by selectively determining any combination of the parameters in the equation.

Where successive transistor base-emitter junctions are used for the bridge pn junctions, provision must be made to account for emitter current in excess of that which is necessary for a succeeding base electrode to condition the succeeding emitter to conduct the desired current. This occurs because the base-emitter junction potential is produced effectively by the collector-emitter current and not the base-emitter current conducted. The excess emitter current from transistor Q44 in FIG. 4 is shunted from the base electrode of transistor Q45 by the constant current source IS15. The two sides of equation (1) may thus be equilabrated by adjusting particular junction areas or by directing the necessary current therethrough. Thus, for example, the designer may select the current to be conducted by transistor Q44, Q45 the diode D53 and the current sourced by source IS13, and then apportion the areas of each of the junctions in accordance with balancing equation (1).

The quiescent current conducted by diode D53 and the idling current conducted by the emitter electrode of pull-up transistor Q45 establish the ratio of the junction areas of the pull-down devices, i.e., Q47 and Q46. It can be shown that the ratio, R, of the junction areas of Q47:Q46 is given by the equation $$R = (IQ45 - ID53)/ID53 \qquad (2)$$

where IQ45 and ID53 are respectively the quiescent currents conducted by the emitter electrode of transistor Q45 and the diode D53.

The current conducted by diode D53 can be viewed as the feedback current required to establish that the total idling current sourced and sunk from the output terminal sums to zero. The designer has the option of selecting the ratio of the pull-down elements Q46 and Q47 and selecting a desired idling current IQ45 from which he can then determine the quiescent current to be conducted in diode D53 from equation (2). He may then select the current to be conducted by the emitter electrode of transistor Q44 and arbitrarily select the junction areas of transistor Q44, Q45 and diode D53, and using equation (1) determine the remaining parameters.

In the foregoing material the invention has been described in terms of bipolar transistors and diodes. The circuit may also be realized using field effect transistors and field effect transistors biased in the diode mode in which they conduct current unidirectionally to produce a current dependent offset potential much like a conventional diode. It is also possible to form a mixed bipolar FET circuit—for example, the output transistors may be bipolar devices and the driver transistor an FET and the claims should be construed with sufficient breadth to encompass these variations.

What is claimed is:

1. A push pull amplifier comprising:

first and second terminals for supplying relatively positive and relatively negative supply potential respectively;

first and second current sources for supplying and sinking substantially equal currents;

first, second and third transistors of like conductivity type each having respective first and second electrodes, a principal conduction path therebetween, and having respective control electrode and wherein said principal conduction paths are controlled by respective potentials applied across their respective first and control electrodes;

a bridge circuit including first and second parallel connected arms, a first arm of which includes a plurality N of serially connected diode means and a second arm of which includes a series connection of the control and first electrodes of said second transistor and at least one diode means, the total number of series connected elements in the second bridge arm totaling N and wherein said at least one diode means is connected between the first electrode of the second transistor and the first bridge arm;

means serially connecting the first and second current sources, the bridge circuit and the principal conduction path of the first transistor between said first and second terminals with the first and second current sources most near to the first and second terminals respectively;

a current mirror amplifier having an input electrode connected to the first terminal of the first transistor and having an output terminal connected to the interconnection of the first electrode of said second transistor and said at least one diode means, said current mirror including said third transistor with its principal conduction path serially connected with the current mirror output terminal for determining its output current and wherein output signal is available from said push-pull amplifier from the first electrode of said second transistor.

2. The push-pull amplifier set forth in claim 1 wherein the bridge circuit comprises:

a first bridge arm having two serially connected diode means; and a second bridge arm including the series connection of the control and first electrodes of said second transistor and one diode means and wherein said control electrode of the second transistor is connected to one end of the first bridge arm and said one diode means is connected between the first electrode of said second transistor and the other end of said first bridge arm.

3. The push-pull amplifier set forth in claim 1 wherein the bridge circuit comprises:

a first bridge arm having three serially connected diode means;

a second bridge arm including a fourth transistor having first, second and control electrodes, the control and first electrodes of said fourth transistor being connected between a first end of said second arm and the control electrode of said second transistor, the first electrode of said second transistor being connected to a first end of said at least one diode means, a second end thereof being connected to a second end of said bridge arm.

4. The push-pull amplifier set forth in claim 1, 2 or 3 wherein each of said diode means comprises a transistor having respective control and second electrodes interconnected to form a first diode terminal and said transistor first electrode forming a second diode terminal.

5. The push-pull amplifier set forth in claim 1, 2 or 3 wherein the current mirror amplifier comprises:

said third transistor having its control, second and first electrodes respectively connected to the current mirror amplifier input, output and common terminals; and further diode means connected between the current mirror amplifier input and common terminals and poled to conduct in a direction parallel with the principal conduction path of the third transistor.

6. The push-pull amplifier set forth in claim 5 wherein said first, second and third transistors are npn type bipolar transistors.

7. A push-pull amplifier comprising:

first and second transistors of a like conducitivity type, and a third transistor, each transistor having first, second and control electrodes and having a principal conduction path between its first and second electrodes controlled by a potential between its control and first electrode;

first and second current sources;

a bridge circuit including a like number greater than one of current dependent potential offset means in each of two arms, the bridge arms terminating in first and second common ends, one of said arms serially including the control and first electrodes of said first transistor with the first electrode of said first transistor remote from said first and second common ends;

means for serially connecting the first current source, the bridge circuit the second and first electrodes of the third transistor and the second current source in the recited order;

means for connecting the control and second electrodes of the second transistor to the respective first electrodes of the third and first transistors respectively; and means for connecting the control and first electrodes of the second transistor across said second current source.

8. The amplifier set forth in claim 7 further including means connected between the control and first electrodes of the second transistor to configure the second transistor therewith as the output transistor of a current mirror amplifier.

9. The amplifier set forth in claim 8 wherein the current dependent potential offset means are unidirectional current conducting devices.

10. The amplifier set forth in claim 9 wherein the unidirectional current conduction devices comprise pn semiconductor junctions.

11. The amplifier set forth in claim 8, 9 or 10 wherein the means connected between the control and first electrodes of the second transistor to configure the second transistor therewith as the output transistor of a current mirror amplifier is a further transistor similar to said second transistor, said further transistor having its control and second electrodes connected to the control electrode of the second transistor and having its first electrode connected to the first electrode of the second transistor.

12. The amplifier set forth in claims 7, 8, 9 or 10 wherein the bridge circuit includes two forward biased diode means in a first of said two arms and a forward biased diode means serially connected with the first electrode of the first transistor in a second of said two arms and wherein output signal from the amplifier is available at the first electrode of said first transistor.

13. A push-pull amplifier comprising:

first and second bipolar transistors of a first conductivity type and a bipolar driver transistor, each having collector, base and emitter electrodes;

first and second constant current sources for sourcing and sinking equal currents, said first and second current sources connected as collector and emitter loads respectively for said driver transistor;

a bridge circuit connected between the first current source and the driver transistor collector electrode, said bridge circuit having a plurality N of pn junctions in a first arm thereof and a plurality N of pn junctions in a second arm thereof one of which being the base-emitter junction of the first transistor, there being at least one pn junction in said second arm interposed between the emitter electrode of the first transistor and the collector electrode of the driver transistor;

means for connecting the collector and base electrodes of the second transistor to the emitter electrodes of the first and driver transistors respectively;

potential supply means connected for conditioning the first and second transistors for normal operation; and wherein input signal potential is applied to the base electrode of the driver transistor and output signal is available at the emitter electrode of the first transistor.

* * * * *

UNITED STATES PATENT AND TRADEMARK OFFICE
CERTIFICATE OF CORRECTION

PATENT NO. : 4,442,409

DATED : Apr. 10, 1984

INVENTOR(S) : Donald R. Preslar

It is certified that error appears in the above-identified patent and that said Letters Patent is hereby corrected as shown below:

Column 6, Line 51 "ID50/AD50·ID51/AD51·ID52/AD52=IQ4-4/AQ44.IQ45/AQ45.ID3/AQ53" should be $$\frac{ID50}{AD50} \cdot \frac{ID51}{AD51} \cdot \frac{ID52}{AD52} = \frac{IQ44}{AQ44} \cdot \frac{IQ45}{AQ45} \cdot \frac{ID53}{AQ53}$$

Claim 1, Column 8, Line 10 "electrode" should be --terminal--.

Claim 1, Column 8, Line 11 "terminal" should be --electrode--.

Signed and Sealed this

Sixteenth Day of October 1984

[SEAL]

Attest:

Attesting Officer

GERALD J. MOSSINGHOFF

Commissioner of Patents and Trademarks